US005321429A

United States Patent [19]

Ono et al.

[11] Patent Number: 5,321,429

[45] Date of Patent: Jun. 14, 1994

[54] OPTICAL PRINTING HEAD FOR OPTICAL PRINTING SYSTEM

[75] Inventors: Kouichirou Ono; Makoto Yonezawa, both of Tottori, Japan

[73] Assignees: Sanyo Electric Co., Ltd., Osaka; Tottori Sanyo Electric Co., Ltd., Tottori, both of Japan

[21] Appl. No.: 664,389

[22] Filed: Mar. 4, 1991

[30] Foreign Application Priority Data

Mar. 7, 1990 [JP] Japan .............................. 2-22811[U]
Dec. 21, 1990 [JP] Japan .............................. 2-404878

[51] Int. Cl.5 ......................... G01D 15/14; H05K 5/00

[52] U.S. Cl. ................................ 346/107 R; 174/52.1

[58] Field of Search ...................... 346/107 R; 357/75; 362/800; 313/500; 361/399; 174/52.1; 403/225, 291, 372

[56] References Cited

U.S. PATENT DOCUMENTS

| | | | |
|---|---|---|---|
| 3,415,153 | 12/1968 | Steiner | 403/372 X |
| 3,438,660 | 4/1969 | Steiner | 403/372 |
| 3,852,643 | 12/1974 | Seki et al. | 317/100 |
| 4,251,852 | 2/1981 | Ecker et al. | 361/399 X |
| 4,314,309 | 2/1982 | Read | 174/52.1 X |
| 4,318,597 | 3/1982 | Kotani et al. . | |
| 4,330,812 | 5/1982 | Token | 361/399 X |
| 4,733,127 | 3/1988 | Takasu et al. . | |
| 4,734,714 | 3/1988 | Takasu et al. | 346/107 R |
| 4,751,522 | 6/1988 | Henzi et al. | 346/107 R |
| 4,821,051 | 4/1989 | Hediger | 346/160 X |
| 4,829,321 | 5/1989 | Iizuka et al. | 346/107 R |
| 4,930,915 | 6/1990 | Kikuchi et al. | 400/175 |
| 5,014,074 | 5/1991 | Dody et al. | 346/107 R |

FOREIGN PATENT DOCUMENTS

| | | | |
|---|---|---|---|
| 59-170816 | 3/1984 | Japan . | |
| 62-282957 | 2/1987 | Japan . | |
| 0078890 | 4/1987 | Japan | 357/75 |

*Primary Examiner*—Benjamin R. Fuller
*Assistant Examiner*—David Yockey
*Attorney, Agent, or Firm*—Darby & Darby

[57] ABSTRACT

An optical printing head for an optical printing device includes a long board with aligned light emitting diode arrays having a plurality of light emitting areas mounted and fixed on the board thereof, a holder provided with a staged portion therein, a fixing by pressure means for fixing the board to the staged portion of the holder by pressure and a lens array held at a predetermined position with respect to the board by the holder. This arrangement allows an optical printing head to be made small in scale and easy to be assembled without deteriorating printing quality.

7 Claims, 6 Drawing Sheets

OPTICAL PRINTING HEAD FOR OPTICAL PRINTING SYSTEM

BACKGROUND OF THE INVENTION

1. Field of the Invention

The present invention relates generally to an optical printing head for an optical printing system using an array of light emitting diodes (referred to as "LED" hereinafter), and more particularly, to a structure of an optical printing head which can be made small in scale and can be assembled with more ease without deteriorating printing quality.

2. Description of the Background Art

In recent years, optical printing systems using a combination of a small light emission point and a photoreceptor have been developed for use in terminal devices for computers, regular paper copying machines, image storing and printing devices and the like because of their advantages of high speed and noiseless operation, high resolution, and high printing quality operation. These optical printing systems are referred to as laser printers, LED printers and the like depending on the type of light source used therein.

One of the optical printing systems using an optical printing head having light emitting areas corresponding to printing dots is disclosed, for example, in U.S. Pat. No. 4,318,597. With reference to FIG. 1, in the optical printing system disclosed in the U.S. Patent with LED arrays 1 disposed alternately in two rows in a staggered configuration, data generated by a control unit 3 is transmitted in series to a shift register 4, thereby causing a LED driver 5 to drive one row of light emitting diode arrays by delaying the same by a memory, to perform predetermined printing.

Operations of a mechanical portion of this optical printing system are as follows. A photosensitive surface 7*a* of a photosensitive drum 7 to be driven to rotate by a motor 6 is first charged by a corona charger 8 before exposure. Thereafter, photosensitive surface 7*a* is exposed by LED array 2 and a short focus lens array 9 (hereinafter referred to as a "lens array"). As a result, the electric charges at the exposed portion of photosensitive surface 7*a* are neutralized, so that out of toner 11 applied on photosensitive surface 7*a* in a developing unit 10, the toner only on the exposed portion is transferred onto a sheet of printing paper 13 at a transfer stage 12. The toner 11 left on the non-exposed portion of photosensitive surface 7*a* is removed at a cleaning stage 14. A perspective schematic type arrangement of photosensitive drum 7, LED array 2 and lens array 9 is as shown in FIG. 2.

Relative positioning of LED array 2, lens array 9 and photosensitive drum 7 is disclosed in Japanese Patent Laying-Open No. 59-170816 and Japanese Patent Laying-Open No. 62-282957. In the positioning disclosed in these documents, the temperatures of the LED arrays and driving elements therefor increase by controlling lighting. In addition, the depth of focus of the lens array is small and the distance between a light source and a photosensitive surface (i.e. an object-image surface distance) should be precisely set within a conjugation length, with a margin as small as around ±0.2 mm. In particular, such variation caused after positioning should be prevented as variation in an optical position caused by a board curve due to the increased temperature thereof resulted from driving of a LED array.

A means for preventing this variation in optical position is disclosed, for example, in U.S. Pat. No. 4,733,127. As shown in FIG. 3, the device disclosed in this U.S. Patent is provided with a flat radiator plate 15 on which a board 1 with a LED array 2 attached thereto is fixed by means of an adhesive material or the like, and a lens holder 16 for holding a lens array 9 is fixed by means of, for example, screws 17, thereby preventing effects of thermal deformation to maintain a once adjusted optical distance. In addition, a transparent glass plate 19 supported by protection frames 18 covers over LED array 2.

As shown in FIG. 4, lens array 9 is structured, for example, by optical fiber lens 9*a* sandwiched by sandwich plates 9*b*. The refractive index of optical fiber lens 9*a* is at a maximum at the axial center thereof and decreases approximately directly as the square of a radius from the axial center. The optical fiber lens therefore serves as a convergent lens even if a light receiving and emitting plane is flat, thereby converging the light emitted from LED array 2 positioned at a distance of the focal length f from the light receiving end surface of lens array 9 onto a photosensitive surface 7*a* positioned at a distance of the focal length f from the light emitting end surface of lens array 9 as shown in FIG. 5.

A converging rod lens array consisting of, e.g. the SELFOC lenses can be used in place of lens array 9 including optical fiber lens 9*a*. The ELFOC lenses have a radial distribution of refractive indexes from its center toward its periphery to allow light to pass therethrough in a zigzag direction in a fixed cycle, thereby functioning as image forming lenses.

However, the structure of the optical printing head shown in FIG. 4 requires a radiator plate 15 having a large area for fixing board 1 and lens holder 16 thereon, which is followed by an increase of a longitudinal width of the optical printing head. Taking into consideration that many parts such as corona charger 8 and developing unit 10 are arranged on the periphery of photosensitive drum 7 of the optical printing system to which the optical printing head is attached as shown in FIG. 1, the increased width of the optical printing head prevents a reduction in scale of the system.

In addition, in order to securely fix board 1 and lens holder 16 on radiator plate 15 for keeping the optical distance constant, many screws 17 and other fixing members are required. With many fixing members required, fixing the members for adjusting the above-described optical distance is very complicated, and moving the fixing members when the optical printing head is fixed results in a displacement of relative position of the adjusted optical elements.

SUMMARY OF THE INVENTION

An object of the present invention is to provide an optical printing head for an optical printing system which is made smaller in scale and assembled with ease without deteriorating printing quality.

In order to achieve the above-described object, the optical printing head according to the present invention includes a long board with an LED array having a plurality of light emitting areas arranged and secured thereon, a holder provided with a staged portion therein, a pressure means for fixing the board to the staged portion of the holder by pressure and a lens array held at a predetermined position with respect to the board by the holder.

In this structure, the board with the LED array mounted thereon, and the lens array are fixed in the same holder for relative positioning. As a result, accuracy in relative positioning of the LED array and the lens array depends substantially only on a structural precision of the holder, so that a fine adjustment at the time of assembling is not required. In addition, the LED array and the lens array are fixed not by means of screws but by pressure to facilitate assembly.

In the optical printing head according to the present invention, the edge of the holder is fixed to the opposite side surfaces of the board along the longitudinal direction thereof. That is, the board is fixed to the holder in the longitudinal direction of the board and therefore, firm fixing can be achieved using a board of a small width.

More specifically, the staged portion in the holder constitutes a connection portion between a narrow opening provided at the holder and a wide opening in communication with the same, with a lens array fit in and held in the narrow opening and the board held in the wide opening.

In accordance with another aspect of the present invention, the optical printing head according to the present invention includes a long board, a plurality of LED arrays mounted on this board to have light emitting areas over a length of main scanning by a printer, a holder provided with staged portions along the direction of the above-described LED arrays, pressure means for resiliently fixing the board to the staged portion by pressure and a lens array held at a predetermined position with respect to the board by the holder.

According to this arrangement, it is possible to securely attach the board to the staged portion over the longitudinal areas in particular when the board is not hard, because the board is resiliently fixed to the staged portion by pressure in the direction of main scanning by a printer, that is, in the direction LED arrays are arranged. Relative positioning of LED arrays and a lens array therefore can be carried out over the full length with high precision.

The effects of the present invention are as follows.

Since the board is fixed by the holder for fixing the lens array, the width of the optical printing head can be reduced to about one-third of that of a conventional one, so that the optical printing head does not occupy a large area above a photoreceptor. In addition, holding and fixing the board in a longitudinal direction in which the board is most likely to bend avoids a bend of the board during drive regardless of a method of driving. This prevents the distance between a light emitting area and a lens array from varying from a predetermined value which causes deterioration of printing quality.

Furthermore, since the board is fixed by pressure and therefore, it is possible to fix, for example, a plurality of boards. In addition, the board can be fixed to the staged portion by pressure by engaging the board with a pawl disposed at the inner surface of the holder or by inserting the board into its guiding portion provided in the holder, with a compressible cushioning material arranged therein, which facilitates assembly of the device.

Furthermore, light emitting areas and a lens array can be optically adjusted by sliding the board remaining pressed or by adjusting a height or a gradient of the lens array at the time of its attachment, which eliminates the necessity of a plurality of independent fixing means such as screws to facilitate optical adjustment and modification. Therefore, when in fixing such optical printing head to an optical printing system, it is not necessary to perform an optical adjustment again because of loosened screws during a fixing operation thereof, thereby simplifying the fixing operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
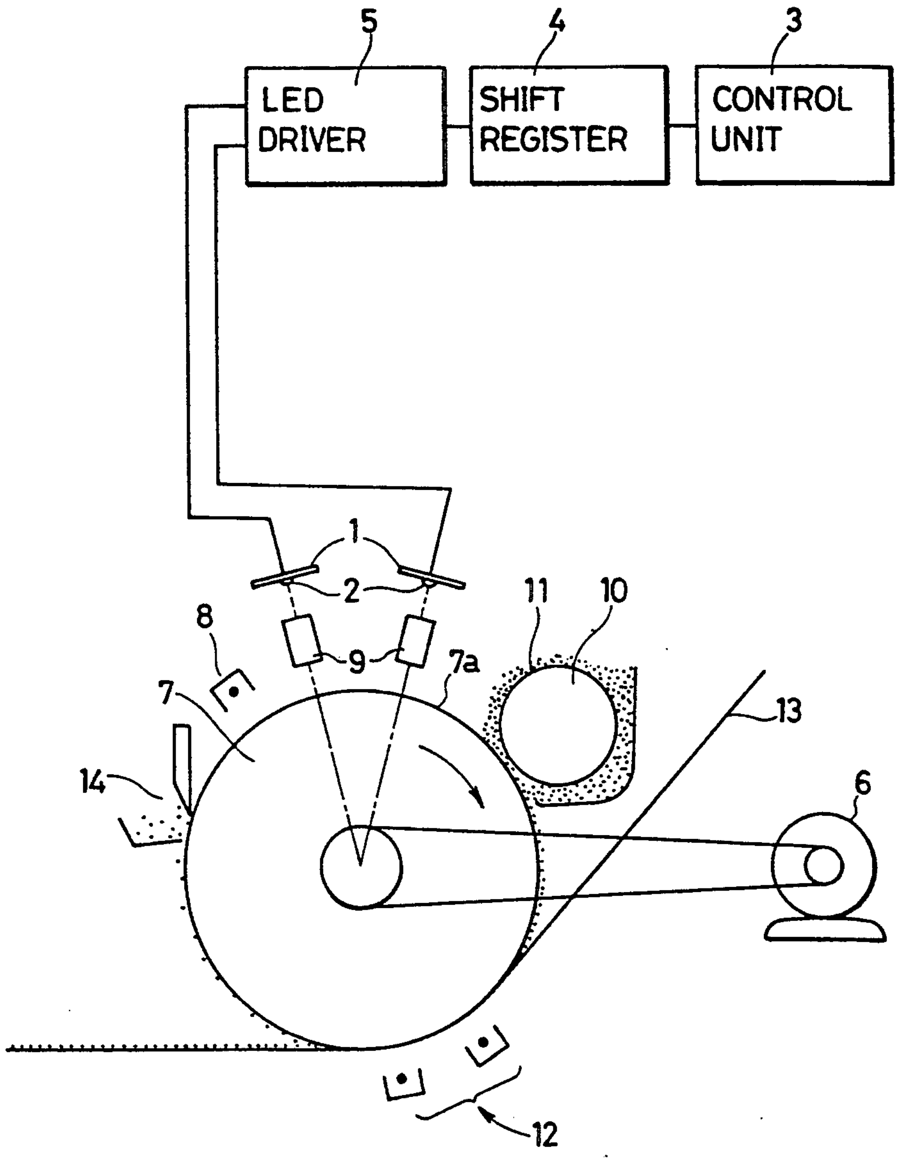
FIG. 1 PRIOR ART
FIG. 1 is a diagram explaining an outline of a conventional optical printing system.
Figure 2:
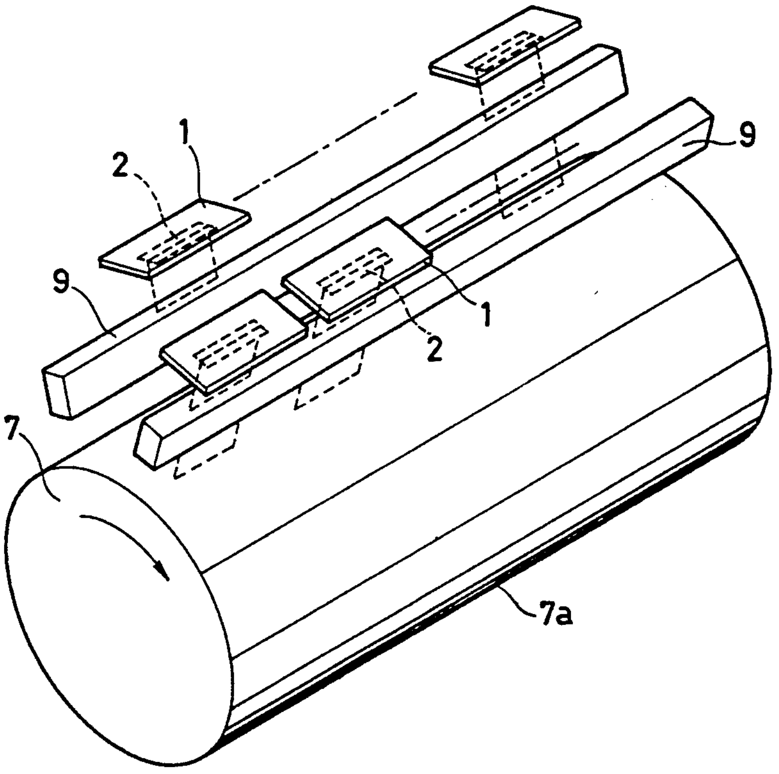
FIG. 2 PRIOR ART
FIG. 2 is a perspective view showing a solid locational relation among a LED array 2, a lens array 9 and a photosensitive drum 7 of the optical printing system shown in FIG. 1.
Figure 3:
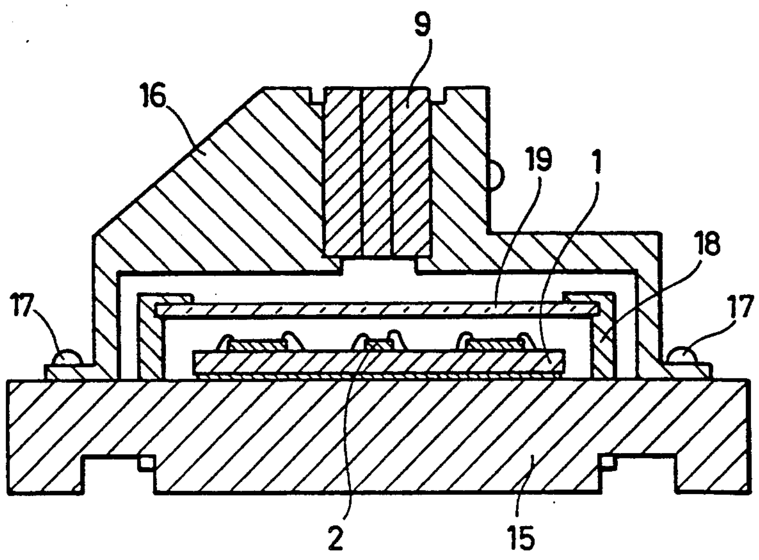
FIG. 3 PRIOR ART
FIG. 3 is a sectional view showing a conventional optical printing head structured to prevent variation in a relative optical position between LED array 2 and lens array 9.
Figure 4:
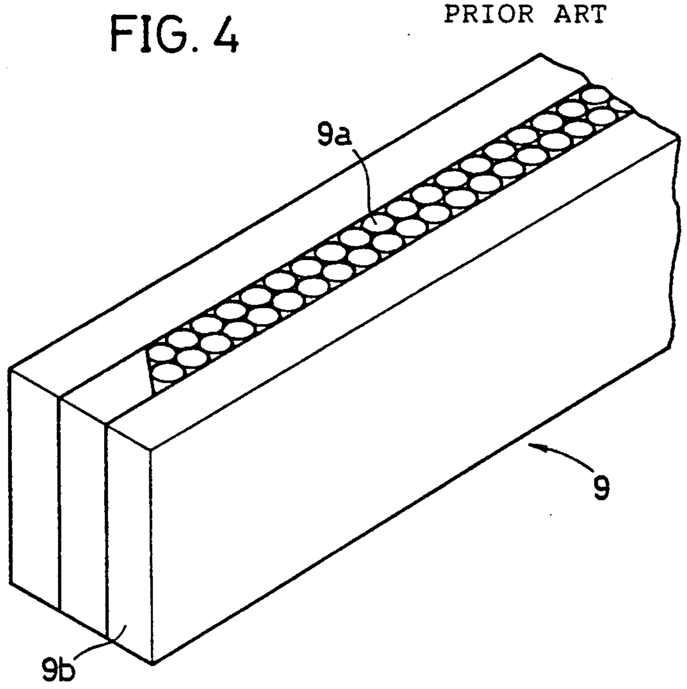
FIG. 4 PRIOR ART
FIG. 4 is a perspective view showing an enlarged section of lens array 9 taken at the center thereof in the longitudinal direction.
Figure 5:
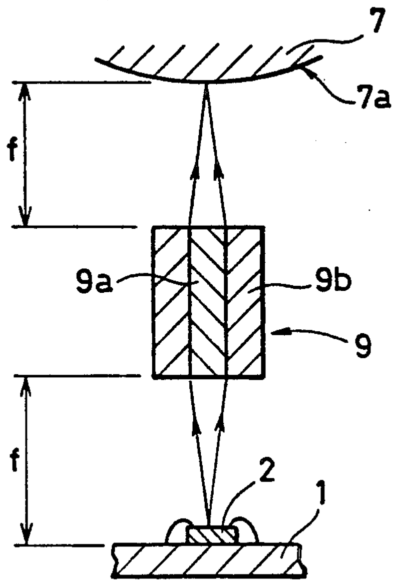
FIG. 5 PRIOR ART
FIG. 5 is a sectional view explaining an optical function of lens array 9.
Figure 6:
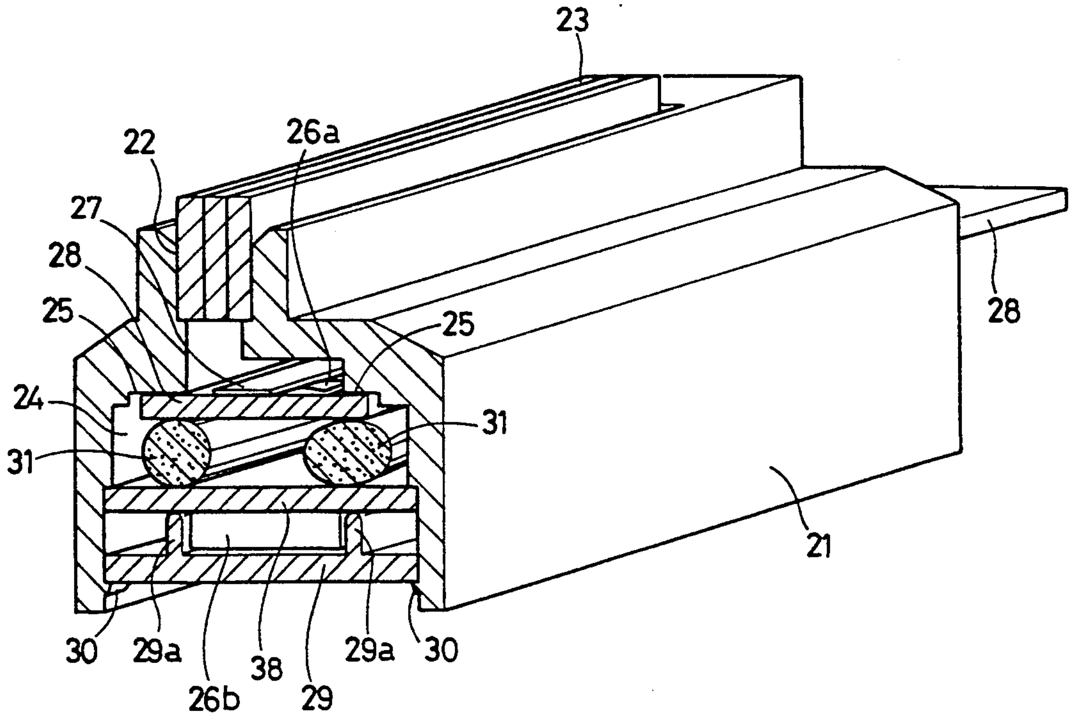
FIG. 6 is a perspective view showing an optical printing head according to one embodiment of the present invention.

One embodiment of the present invention will be described in the following with reference to FIG. 6. The optical printing head shown in FIG. 6 comprises a long lens array 23 fit in a narrow upper opening 22 provided at an upper portion of a holder 21. Provided in the lower portion of holder 21 is a wide lower opening 24 communicating with upper opening 22. In the upper part of the lower opening, a board 28 with data driving elements 26*a* and a LED array 27 having a plurality of light emitting areas mounted and secured thereon, is fixed to a staged, i.e., shoulder, portion 25 bordering on upper opening 22, by pressing the opposite side portions of the board surface along the longitudinal direction thereof against the staged shoulder portion.

Board 28 is formed of such materials as ceramics or glass epoxy of 7 mm width and 270 mm length, for example. In order to reduce bending board 28 preferably has a wide print pattern formed on both sides of its surface. In addition, 28 LED arrays 27 are aligned and secured in one column, each of which arrays 27 has a length of about 8 mm and includes light emitting areas aligned at a rate of 400 dots per inch (about 16 dots/mm), and therefore, the light emitting areas are aligned over the full length of the main scanning direction by the optical printing head. (see U.S. Pat. No. 4,734,714, for example)

In addition, the driving elements for LED arrays 27 mounted on board 28 enable many wirings for each light emitting area of LED array 27 to be made separately from other wirings. Furthermore, the optical printing head according to the present embodiment is applicable to a generally called dynamic driving system which is increasingly used in recent years and wherein each LED is driven in a time divisional manner. In the dynamic driving system, a data driving element 26a is wired in common to light emitting areas of each of LED arrays 27 and a common driving element 26b is connected to each LED array 27. In this connection, the wirings for the data driving elements 26a are crossed with each other 27 to make the wirings complicated, and common driving element 26b requires a large amount of current. Therefore, as shown in FIG. 6, data driving element 26a is secured on the same surface of the circuit board as LED array 27 is secured thereon and common driving element 26b is secured on another driving board 38, on both of which boards the wirings are provided.

While holder 21 is preferably formed of a metal molding, it can be also made of polycarbonate, polyphenylene sulfide (PPS), polybutyrene terephthalate (PBT) or fiber reinforced plastics (FRP) of the same and a metal matrix compound material (MMC). In addition, provided in wide lower opening 24 of holder 21 is board 28 disposed in contact with staged portion 25 such that the light emitting areas of LED arrays 27 are positioned corresponding to upper opening 22. A reference line (not shown) indicative of a position of a column of the light emitting areas is indicated and an attaching means for fixing the optical printing head to the optical printer is provided at the end portion of board 28. Board 28 juts out from holder 21 in the direction the light emitting areas of LED array 27 are aligned such that the attaching means is located outside holder 21. Consequently, in the optical printing head according to the present embodiment, the surface of board 28 is used as an optical reference plane and the optical reference fixed to the device, which facilitates attachment of the device and improves printing quality.

Board 28 is fixed to staged portion 25 by pressing a pressure plate 29 against the board. Pressure plate 29 has pressure pawls 29a and is formed of a long resin molding or the like slightly shorter than board 28 and as long as holder 21. Pressure plate 29 is fixed in holder 21 by engaging with an engagement pawl 30 provided at the inner wall of holder 21 and fitting therein. Although a plurality of longitudinal plates can be used as pressure plate 29, the number of the plates should be reduced to two or three. Then, when a driving board 38 is provided separately from board 28 as shown in FIG. 6, both boards are pressed against staged portion 25 by means of pressure plate 29, with spacing of compressible cushioning materials 31 made of elongated cylindrical elastic rubber or the like interposed between the two boards. In this case, by fixing, by pressure by using bumping material 31, joint portions of the wirings of board 28 and driving board 38, and wiring means such as a flexible board leading to a terminal and a flat cable, the joint portions can be prevented from peeling. In addition, the surface of compressible spacers 31 with a conductive pattern formed thereon can be used as a wiring means. As described above, pressure plate 29 and compressible spacers 31 constitute a fixing by pressure means for board 28 and driving board 38.

Lens array 23 comprises for example, a group of lenses fixed by resin. LED array 27 is fit in upper opening 22 and fixed therein by an adhesive material or the like such that the optical center of lens array 23 focuses on the column of the light emitting areas of LED array 27.

In a case of dynamic drive where a temperature rise is small, a bend of a board in the longitudinal direction can be reduced even if the board is made of a plurality of members stacked. On the other hand, in static drive in which printing of one column of LED arrays is simultaneously controlled by lighting, a large amount of heat is developed and the board temperature rises so high that it can exceed 80° C. Therefore, the array should be fixed more securely and effectively.

Figure 7:
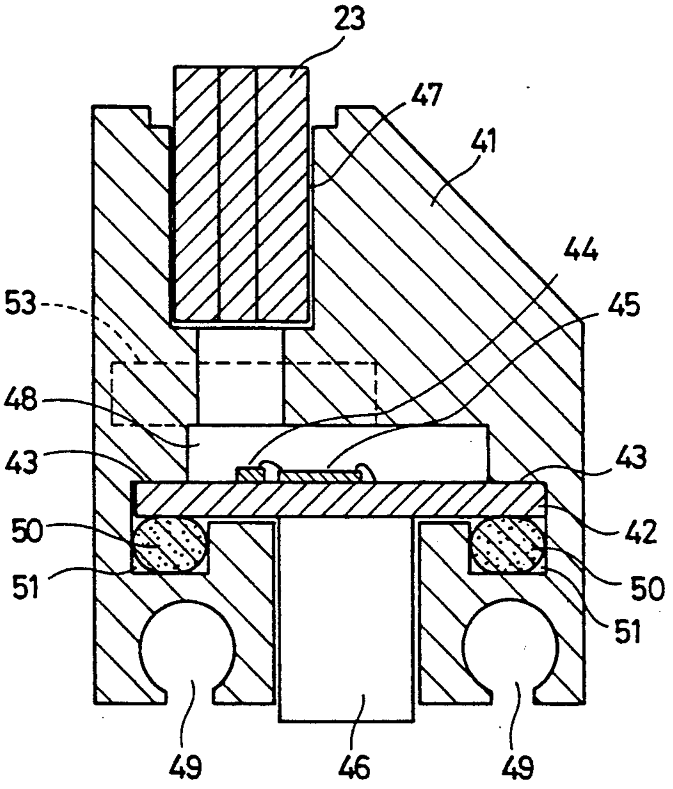
FIG. 7 is a sectional view showing an arrangement of an optical printing head according to another embodiment of the present invention.
Figure 8A:
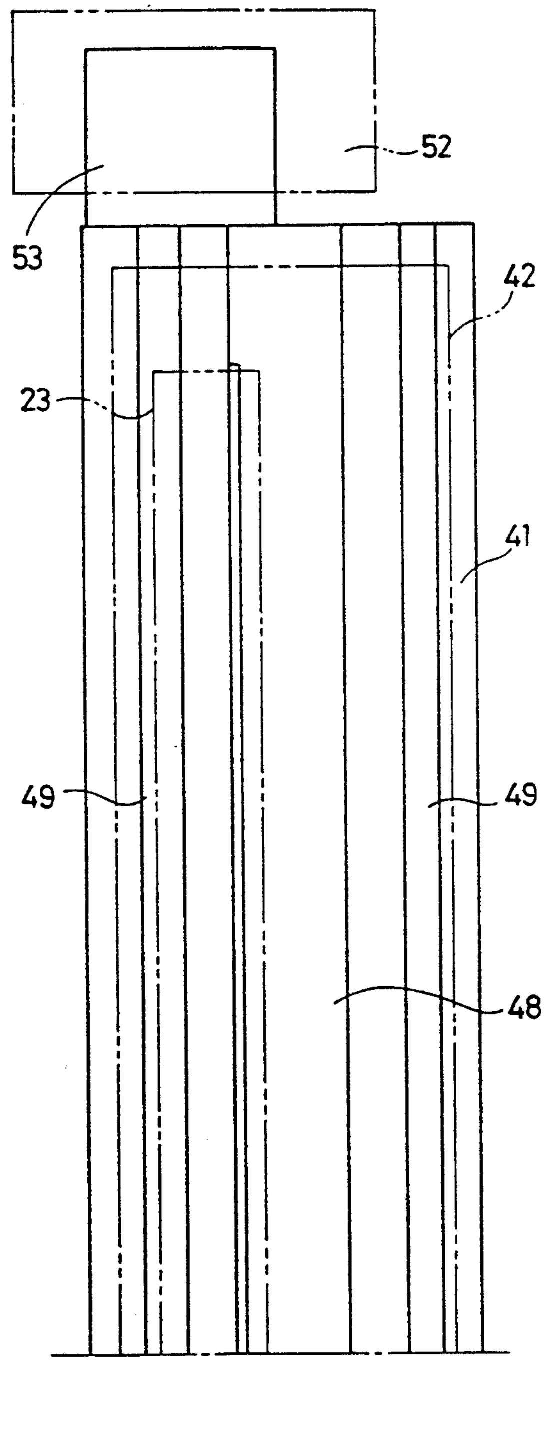
FIG. 8A is a bottom view showing only one half of the optical printing head shown in FIG. 7, obtained by dividing the same, at the center of the longitudinal direction.

Another embodiment of the present invention will be described with reference to FIGS. 7, 8A and 8B in the following. This embodiment shows an example of an static drive optical printing head. With reference to FIG. 7, the optical printing head according to the present embodiment, similarly to the above-described embodiment, comprises a holder 41 wherein a long staged portion 43 provided along the longitudinal direction of a board 42 which is fixed by pressure from below along the longitudinal direction.

Figure 8B:
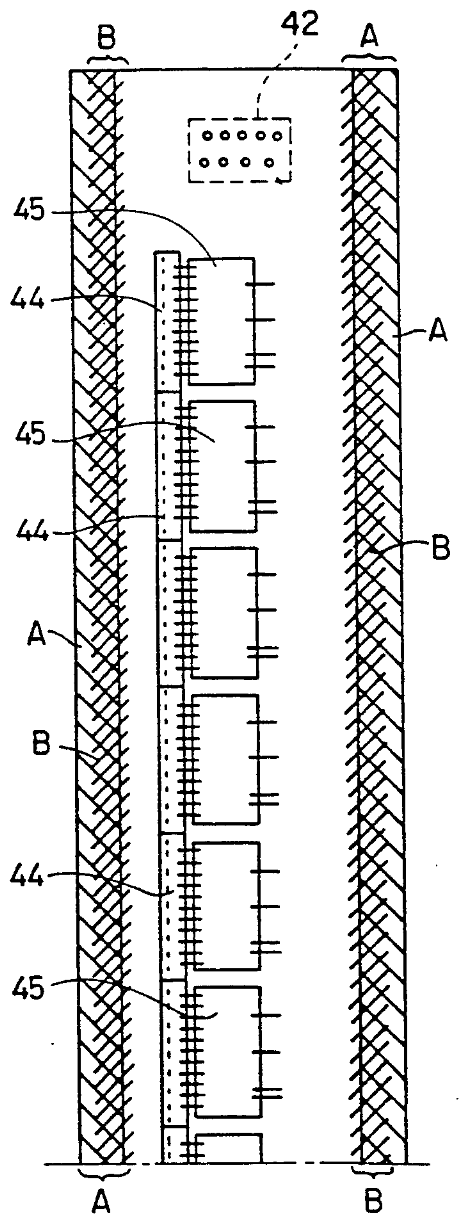
FIG. 8B is a plan view showing one half of board 1 with LED array 2 mounted thereon in the optical printing head shown in FIG. 7, obtained by dividing the board, at the center of the longitudinal direction.

LED array 44 is mounted on board 42 of the present embodiment as shown in FIG. 8B and driving elements 45 are disposed in parallel with and connected to LED array 44. A terminal 46 for supplying power and data is provided at the underside of board 42.

Holder 41 comprises an upper opening 47, a lower opening 48, a rail guide 49 and a guide portion 51 for housing the cushioning spacers materials all of which are formed by die-casting aluminum, with upper opening 47 and lower opening 48 being press-blanked to communicate with each other. Provided at the end portions of board 42 are attaching means 53 to be attached to optical adjusting means 52 at the opposite edges of the optical printing head (see FIGS. 7 and 8A). Therefore, board 42 is fixed by pressure to staged portion 43 of holder 41 by inserting board 42 from one end portion of holder 41, that is, from one open end of lower opening 48 to be disposed at a predetermined position and disposing quasi cylindrical cushioning material spacers 50 in guide portions 51 provided at the bottom portion of holder 41. That is, board 42 is sandwiched between staged portion 43 presses against the region A of the upper surface indicated by the chain dotted slant line in FIG. 8B and cushion material piece 50 presses against the region B of the lower surface indicated by the broken slant line along the longitudinal direction of board 42 as shown in FIG. 8B. With this arrangement, there occurs no undesirable phenomenon that board 42 bent due to its high temperature during drive of the LED arrays causes the distance between the light emitting areas and the lens array to vary from a predetermined value.

In any of the above-described embodiments, when board 28 and 42 are formed of such a material relatively easy to bend as epoxy resin or ceramic mixed epoxy resin using paper or glass fiber as a core material, boards 28 and 42 can be fixed in holders 21 and 41 by means of fastening members such as screws after adjusting optical positions at the opposite ends of holders 21 and 41, or at three points including those of the opposite ends and the center. In addition, wide lower opening 48 of the embodiment shown in FIG. 7 may be a cavity with the lower surface thereof enclosed. In this case, the bottom surface should have a hole through terminal 46, the hole provided only at a portion where terminal 46 protrudes.

In the foregoing embodiments thus arranged, the width of the optical printing head comprising a LED array and a lens array can be reduced to about one-third. This is because in a conventional arrangement radiator plate 15 requires a width including a width by which an optical adjusting member can be allowed to move, in addition to the width of board 1, the thickness of protection frame 18 and the width required for fixing lens holder 16, while the arrangements of the above-described embodiments require the width of an addition of the width of board 28, 42 and the thickness of portions of holder 21, 41, the portions being in contact with the opposite sides of board 28, 42.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An optical printing head comprising:

an elongated circuit board;

a plurality of light emitting diode arrays mounted along the length of said circuit board to have light emitting areas for energization upon scanning by a printer, an elongated holder for said circuit board having a length and a hollow central section and provided with a staged internal portion along said length of said holder;

an elongated elastic compressible body unfixed within said holder and acting against an internal first portion of said holder spaced from said staged portion and against one face of said circuit board for resiliently fixing said circuit board against said staged portion by a pressure produced by said compressible body, an elongated pressure plate between said holder first portion and said elongated elastic body, and a lens array supported by said holder at a predetermined position with respect to said circuit board and the light emitting diode arrays.

2. The optical printing head according to claim 1, wherein said elongated circuit board has ends and at least one of said ends extends out to said holder to form an attachment portion to a printer.

3. The optical printing head according to claim 1, wherein said elongated holder has longitudinal ends, and an attachment portion to a printer is provided at said ends of the elongated holder.

4. The optical printing head according to claim 1, wherein said pressure plate is fixed to said holder by an elongated fastening member which engages the holder and the pressure plate.

5. The optical printing head of claim 1 wherein said elongated circuit board has a predetermined width and said internal staged portion of said holder comprises a pair of spaced shoulders corresponding to the width of the elongated circuit board and opposing a face of said board, said elongated elastic compressible body comprising two elongated compressible members with each of said members acting against said holder first portion and against edges along the length of the circuit board.

6. The optical printing head of claim 5 wherein a portion of the circuit board between the two elongated compressible members is unsupported.

7. An optical printing head comprising:

an elongated circuit board;

a plurality of light emitting diode arrays mounted on said circuit board to have light emitting areas over the length of the board for energization by a printer, an elongated holder provided with a staged portion along the length of the holder;

fixing means for fixing one face of said circuit board against said staged portion by pressure, said fixing means comprising an elongated elastic compressible body acting against said circuit board and against a first portion of said holder, said first portion being spaced from said staged portion, said fixing means further comprising an elongated pressure plate between said holder first portion and said elongated elastic body, said circuit board, diode arrays and fixing means being aligned lengthwise with said holder, and a lens array supported by said holder at a predetermined position with respect to said circuit board and the light emitting diode arrays.

* * * * *